Nov. 22, 1966 R. ROSENHEINRICH 3,287,187
METHOD FOR PRODUCTION OF SEMICONDUCTOR DEVICES
Filed Jan. 29, 1963
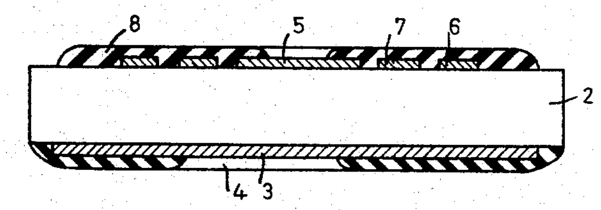

United States Patent Office 3,287,187
Patented Nov. 22, 1966

3,287,187
METHOD FOR PRODUCTION OF SEMICONDUCTOR DEVICES

René Rosenheinrich, Ebermannstadt, Germany, assignor to Siemens-Schuckertwerke Aktiengesellschaft, Berlin-Siemensstadt, Germany, a corporation of Germany
Filed Jan. 29, 1963, Ser. No. 254,783
Claims priority, application Germany, Feb. 1, 1962, S 77,827
8 Claims. (Cl. 148—187)

My invention relates to the production of p–n junction semiconductor devices such as rectifiers, transistors, photodiodes, semiconductor controlled rectifiers or other four-layer devices, or the like. Semiconductor devices of this type generally consist of a substantially monocrystalline semiconductor body of silicon, germanium or intermetallic compound of respective elements from the third and the fifth groups or the second and sixth groups of the Periodic System. The semiconductor body comprises regions of different conductance types or different dopant concentrations and has electrodes being provided on said semiconductor body.

Doping of the semiconductor material may be achieved by adding dopant impurities while the crystal is being pulled from a melt, by applying alloying and diffusing processes to a grown crystal. In general, diffusion of dopant substances into the crystal is effected by heating a predetermined quantity of the particular substance together with the crystal in a closed receptacle, so that dopant atoms will permeate from all sides into the semiconductor body, thus doping it from the outside. After completion of such diffusion process, the resulting outer diffusion zone, as a rule, is subdivided by grooves into a plurality of individual zones. The dividing grooves are produced by mechanical means or by etching and extend into said body down to the core zone of the original conductance type not altered by the diffusion. Normally, part of the core zone is laid bare to the extent required to attach a contact electrode thereto.

In a more particular aspect, my invention relates to production methods of the general kind just mentioned, resulting in a semiconductor device whose substantially monocrystalline semiconductor body comprises a plurality of regions of respectively different conductance types and/or different dopant concentration, the dopant for at least one of these regions being applied upon the semiconductor surface and thermally diffused into the body.

It is an object of my invention to improve dopant-diffusion methods of the just-mentioned kind so as to afford simultaneous diffusion-doping of semiconductor crystals by a plurality of different dopants, such as donors and acceptors, in a single thermal process.

Another object of the invention is to reliably afford diffusion-doping of accurately limited localities of the semiconductor crystal.

Still another object, conjoint with those mentioned, is to secure improved protection from ingress and diffusion of detrimental impurities into the semiconductor crystal, particularly during the heat treatment applied for dopant diffusion.

According to a feature of my invention, I proceed as follows. I first deposit the dopant upon a limited surface area of the semiconductor body. Thereafter, I coat the same surface area with an oxide of the semiconductor material by vapor deposition, and then diffuse the doping substance into the semiconductor surface area by heating the semiconductor body. The doping substance may, for instance, be applied to the limited surface area of the semiconductor surface by painting or printing it thereupon. Preferably, however, the dopant is applied by vapor deposition.

After deposition of the doping substance, oxides of the semiconductor material, for instance silicon dioxide or silicon monoxide, are deposited by vapor deposition. Oxide powders of this type are commercially available. They have the required high degree of purity. If desired, oxides of such purity can also be produced from semiconductor material. For vaporization, these oxides are preferably placed in a tantalum crucible and then heated to the high vaporization temperature. For instance silicon monoxide requires a temperature of more than 700° C., germanium monoxide a temperature above 500° C., silicon dioxide a temperature above 1000° C., and germanium dioxide a temperature above 800° C. The semiconductor bodies with the local coating of doping substance are placed adjacent to the oxide-vapor source so that the bodies are exposed to the vapors. Care is to be taken that the entire area of the semiconductor surface covered by doping substance will now be coated with the oxide layer. It is desirable to also vapor-deposit the oxide layer upon the adjacent areas of the semiconductor surface.

Stencils or masks may be used to keep a small gap or opening free of oxide within the oxide coating beside the area coated with doping substance. Subsequently, another doping substance may be applied upon this gap in the oxide coating and, preferably, may then also be covered with an oxide layer. If desired, different dopants can thus initially be applied by vapor deposition on a plurality of surface areas on the semiconductor body, and these surface areas may subsequently be covered by a common oxide coating.

The vapor deposition of the oxide is preferably followed by after-oxidation, for instance, by heating in an oxygen-containing atmosphere, preferably by means of steam.

After the diffusion of the applied doping substance is terminated, the oxide coating may either be removed or left upon the semiconductor material. It is preferable to remove the oxide from only part of the semiconductor surface so that contact electrodes can be provided on the areas thus exposed. In the other areas the applied oxide layer serves as a protection from undesired penetration of foreign substances, such protection remaining effective during subsequent electric operation of the semiconductor device.

The invention will be further described with reference to the example of producing a transistor as schematically illustrated on the accompanying drawing.

A silicon disc 2 of approximately 12 mm. diameter and 160 microns thickness is used as the first component. The disc consists, for instance, of p-type silicon having a resistivity of about 200 ohm-cm. A layer 3 for producing an n-type region is applied upon one face of the silicon disc 2, the layer 3 may consist of phosphorus or a phosphorus compound. Thus, phosphorus pentoxide $P_2O_5$ may be heated in a graphite crucible to a temperature of approximately 100° C. and then deposited upon the silicon by vapor deposition in vacuum. During this operation the silicon may be kept at normal room temperature (20° C.).

The layer 3 should have a minimum thickness in the order of one micron. A layer of this type can be vapor-deposited in about 5 to 10 minutes. Then the layer 3 is coated with a layer 4 of silicon monoxide SiO. For this purpose, use may be made of a tantalum crucible wherein the silicon monoxide is heated to a temperature of more than 700° C. The thickness of layer 4 may be about 5 microns.

Acceptor and donor dopants are vapor-deposited upon the other face of the silicon disc 2 in an emitter-base pattern. In the present example, a layer 5 of boron trioxide $B_2O_3$ is vapor-deposited in the central circular area having a diameter of approximately 3 mm. The boron trioxide may be heated in a platinum crucible to a temperature of about 1200° C. Within a period of only a few minutes a layer having a thickness of at least 1 micron will form. In the same manner, an annular layer 6 also consisting of boron trioxide and having an inner diameter of 7 mm. and an outer diameter of 9 mm., is applied simultaneously.

Subsequent thereto, an annular layer 7 of phosphorous pentoxide is applied upon the same face of the semiconductor disc 2. The inner diameter of annular layer 7 is 4 mm. and its outer diameter 6 mm. Appropriate masks are used so that the indicated dimensions are precisely observed and maintained and that the spacing between the individual layers at the boundary lines thereof is the same along the entire peripheries thereof. The layer 7 may be obtained in the same manner as layer 3 by vapor deposition in vacuum, and it may also have a thickness of approximately 1 micron.

Subsequent thereto, the top face of the semiconductor disc 2 is also covered with a coating 8 of silicon monoxide, applied by vapor deposition up to a thickness of about 5 to 10 microns.

Then the entire semiconductor element thus obtained is heated in an atmosphere of protective gas, for instance in a furnace, so that the various doping substances diffuse into the semiconductor material and produce correspondingly doped regions therein. The regions thus formed adjacent to the boron-containing layers have high p-type conductance, whereas regions of high n-type conductance are formed at the phosphorus-containing layers. Suitable for this diffusion process is a nitrogen atmosphere, and a heat treatment of the element at a temperature of 1280° C. for a period of approximately 16 hours. The resulting p-type and n-type regions have a thickness of approximately 30 microns.

After completion of the diffusion process the semi-conductor disc 2 constitutes an n–p–n junction device. The n-type region adjacent the initially applied layer 3 may serve as collector. The region at layer 7 may serve as emitter. The p-type regions at layers 5 and 6 form a divided base electrode. After the oxide coatings 4 and 8 have been removed in a few areas, the thus partly exposed surfaces can be contacted by a electric terminals.

It will be apparent that the method of the invention affords the diffusion of various doping substances to be effected in a single operation. The oxide layer prevents vaporization of the doping substances and thus prevents diffusion of dopants from its gaseous phase into all sides of the semiconductor body. The invention, therefore, reliably secures the desired localized diffusion. The applied oxide layers also act as protection from other foreign substances and may prevent the diffusion thereof into the crystal. As the oxide coatings themselves are applied at relatively low temperatures of the crystal surface, any undesired diffusion of other foreign substances into the crystal during performance is also prevented.

The method of the present invention is applicable not only for the production of transistors but also rectifiers, four-layer devices, photo-semiconductor devices and other p-n junction elements. Various modifications with respect to dimensions and materials are applicable without departing from the invention and within the scope of the claims annexed hereto.

I claim:

1. The method of producing a semiconductor junction device having a substantially monocrystalline semiconductor body with regions of respectively different conductance thereon, which comprises coating one surface region of said body with a doping substance for one type of conductance, coating another region of said body with another doping substance for the other type of conductance, vapor-depositing upon said body and said respective dopant coatings a layer of oxide of the same semiconductor material of which said body consists, and then diffusing said doping substances from beneath said oxide layer into the semiconductor body by heating the body.

2. The method according to claim 1, wherein the coating of said doping substances is deposited from the vapor phase.

3. The method according to claim 1, wherein the coating of said doping substances is painted on.

4. The method according to claim 1, wherein the doping substances are chosen from among the oxides of the semiconductor-modifying elements of groups 3 and 5 of the Periodic Table.

5. The method according to claim 1, wherein the vapor deposition of the semiconductor oxide is carried out from vapor sources maintained at temperatures above 500° C. onto the coated body.

6. The method according to claim 1, wherein the vapor deposition of the semiconductor oxide is carried out with said coated body maintained at substantially room temperature.

7. The method according to claim 1 wherein the semiconductor body is subjected to live steam between the oxide deposition step and the final diffusion step.

8. The method of producing a semiconductor junction device having a substantially monocrystalline semiconductor body with regions of respectively different conductance thereon, which comprises coating one surface region of said body with a doping substance for one type of conductance, depositing upon said doping substance an oxide coating leaving uncoated regions to be coated with another doping substance for the other type of conductance, coating said uncoated region with said other doping substance, vapor-depositing upon said body and said respective dopant coatings a layer of oxide of the same semiconductor material of which said body consists, and then diffusing said doping substances from beneath said oxide layer into the semiconductor body by heating the body.

References Cited by the Examiner

UNITED STATES PATENTS

| | | | |
|---|---|---|---|
| 2,794,846 | 6/1957 | Fuller | 136—89 |
| 2,802,760 | 8/1957 | Derick et al. | 148—1.5 |
| 2,974,073 | 3/1961 | Armstrong | 148—188 |
| 3,064,167 | 11/1962 | Hoerni | 148—187 |
| 3,066,052 | 11/1962 | Howard | 148—188 |
| 3,067,071 | 12/1962 | Mutter | 148—179 |
| 3,114,663 | 12/1963 | Klerer | 148—179 |
| 3,145,126 | 8/1964 | Hardy | 148—188 |

HYLAND BIZOT, *Primary Examiner.*

DAVID L. RECK, BENJAMIN HENKIN, *Examiners.*

H. W. CUMMINGS, *Assistant Examiner.*